(12) United States Patent
Choi et al.

(10) Patent No.: US 12,025,671 B2
(45) Date of Patent: Jul. 2, 2024

(54) OVERVOLTAGE CHARACTERISTICS EVALUATION APPARATUS AND METHOD FOR BATTERY

(71) Applicant: LG Energy Solution, Ltd., Seoul (KR)

(72) Inventors: Hyun-Jun Choi, Daejeon (KR); Dae-Soo Kim, Daejeon (KR); Young-Deok Kim, Daejeon (KR); Su-Won Jee, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 129 days.

(21) Appl. No.: 17/915,171

(22) PCT Filed: Jul. 30, 2021

(86) PCT No.: PCT/KR2021/010017
§ 371 (c)(1),
(2) Date: Sep. 28, 2022

(87) PCT Pub. No.: WO2022/025726
PCT Pub. Date: Feb. 3, 2022

(65) Prior Publication Data
US 2023/0119100 A1    Apr. 20, 2023

(30) Foreign Application Priority Data

Jul. 31, 2020 (KR) .......................... 10-2020-0096200

(51) Int. Cl.
*G01R 31/3842*    (2019.01)
(52) U.S. Cl.
CPC .............................. *G01R 31/3842* (2019.01)
(58) Field of Classification Search
None
See application file for complete search history.

(56) References Cited

U.S. PATENT DOCUMENTS

2012/0226455 A1    9/2012    Kumashiro et al.
2014/0152259 A1    6/2014    LePort et al.
(Continued)

FOREIGN PATENT DOCUMENTS

JP          4112895 B2    7/2008
JP       2010032261 A    2/2010
(Continued)

OTHER PUBLICATIONS

Murashko Kirill et al: "Determination of Li-ion Battery Degradation Mechanisms at High C-Rate Charging" '2019 IEEE Vehicle Power and Propulsion Conference (VPPC), IEEE, Oct. 14, 2019, pp. 1-6, XP033687875.
(Continued)

*Primary Examiner* — Jas A Sanghera
(74) *Attorney, Agent, or Firm* — Lerner David LLP

(57) ABSTRACT

An overvoltage characteristics evaluation apparatus for a battery includes a sensing unit to measure a current and a voltage of the battery, and a control unit to determine a measured capacity history and a measured voltage history of the battery during a discharge event executed subsequent to polarization-inducing pretreatment for the battery. The control unit determines a first measured voltage curve indicating a correlation between the measured capacity history and the measured voltage history, and a second measured voltage curve indicating a correlation between a depth of discharge history obtained by normalizing the measured capacity history to a total discharge capacity of the measured capacity history and the measured voltage history. The control unit determines a differential voltage curve by differentiating the measured voltage history. The control unit determines overvoltage characteristics information associated with the polarization-inducing pretreatment by comparing the differ- (Continued)

ential voltage curve with a reference differential voltage curve.

10 Claims, 7 Drawing Sheets

(56) References Cited

U.S. PATENT DOCUMENTS

| | | | |
|---|---|---|---|
| 2016/0049814 A1 | 2/2016 | Sugiyama et al. | |
| 2017/0187201 A1 | 6/2017 | Wang et al. | |
| 2017/0234930 A1 | 8/2017 | Lee et al. | |
| 2018/0031642 A1 | 2/2018 | Sung | |
| 2020/0091734 A1* | 3/2020 | Odegaard | H02J 7/00302 |

FOREIGN PATENT DOCUMENTS

| | | |
|---|---|---|
| JP | 2013135479 A | 7/2013 |
| JP | 2015104138 A | 6/2015 |
| JP | 2016506498 A | 3/2016 |
| JP | 6108065 B2 | 4/2017 |
| JP | 2018063916 A | 4/2018 |
| JP | 6406533 B2 | 10/2018 |
| JP | 2020106317 A | 7/2020 |
| KR | 20120099583 A | 9/2012 |
| KR | 101846690 B1 | 5/2018 |
| KR | 20190120527 A | 10/2019 |
| KR | 20200005290 A | 1/2020 |
| WO | 2020/033343 A1 | 2/2020 |

OTHER PUBLICATIONS

Extended European Search Report for Application No. 21848696.7 dated Nov. 7, 2023. 6 pgs.
International Search Report for Application No. PCT/KR2021/010017 mailed Nov. 25, 2021, 2 pages.

* cited by examiner

OVERVOLTAGE CHARACTERISTICS EVALUATION APPARATUS AND METHOD FOR BATTERY

CROSS-REFERENCE TO RELATED APPLICATIONS

The present application is a national phase entry under 35 U.S.C. § 371 of International Application No. PCT/KR2021/010017 filed Jul. 30, 2021, which claims priority from Korean Patent Application No. 10-2020-0096200 filed Jul. 31, 2020, all of which are incorporated herein by reference.

TECHNICAL FIELD

The present disclosure relates to evaluation technology of polarization induced overvoltage characteristics of a battery.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be repeatedly recharged.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

In predicting the performance of a battery, for example, State Of Health (SOH) and State Of Charge (SOC), voltage and current are basically required battery parameters. The capacity of the battery (or its change) may be determined based on the measured current using Coulomb counting.

Differential Voltage Analysis (DVA) determines a differential voltage curve by differentiating a measured voltage curve indicating a correlation between capacity and voltage of the battery, and determines a degradation parameter of the battery based on a change in size and/or position of feature(s) in the differential voltage curve. The degradation parameter includes, for example, a capacity loss of the positive or negative electrode, lithium deposition, etc.

In determining the degradation parameter using DVA, overvoltage reflected on the measured voltage curve acts as noise in the differential voltage curve due to polarization (for example, a concentration gradient on active material surface). Accordingly, to suppress the polarization causing overvoltage, a process of obtaining the measured voltage curve is usually performed by intermittently discharging or charging the battery with low current (for example, less than 0.5 C-rate). As a result, the polarization induced overvoltage is a key parameter that affects the degradation of the battery, but the existing DVA is difficult to obtain the overvoltage characteristics of the battery.

Additionally, to develop batteries having high safety and performance, it is important to identify a correlation between polarization dependent on the use condition of the battery and its resulting overvoltage characteristics.

SUMMARY

Technical Problem

The present disclosure is designed to solve the above-described problem, and therefore the present disclosure is directed to providing an apparatus and method for evaluating overvoltage characteristics of a battery using Differential Voltage Analysis (DVA).

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

An overvoltage characteristics evaluation apparatus for a battery according to an aspect of the present disclosure includes a current sensor configured to measure a current of the battery, a voltage sensor configured to measure a voltage of the battery a controller and memory having instructions programmed thereon that, when executed by the controller, cause the controller to determine a measured capacity history indicating a time-series change in capacity of the battery using sensing information obtained from at least one of the voltage sensor or the current sensor during a discharge event executed subsequent to polarization-inducing pretreatment for the battery and determine a measured voltage history indicating a time-series change in voltage of the battery using sensing information obtained from at least one of the voltage sensor or the current sensor during the discharge event. The control unit is configured to determine a first measured voltage curve indicating a correlation between the measured capacity history and the measured voltage history. The control unit is configured to determine a second measured voltage curve indicating a correlation between a depth of discharge history obtained by normalizing the measured capacity history to a total discharge capacity of the measured capacity history and the measured voltage history. The control unit is configured to determine a differential voltage curve from the second measured voltage curve by differentiating the measured voltage history with respect to the depth of discharge history. The control unit is configured to determine overvoltage characteristics information associated with the polarization-inducing pretreatment by comparing the differential voltage curve with a reference differential voltage curve.

The discharge event may include constant current discharging from a first time point to a second time point. The voltage of the battery is equal to a first threshold voltage at the first time point. The voltage of the battery is equal to a second threshold voltage that is lower than the first threshold voltage at the second time point.

The instructions may be configured to cause the controller to determine a concentrated overvoltage range in which a differential voltage difference between the differential voltage curve and the reference differential voltage curve is equal to or larger than a threshold difference in an entire range of the depth of discharge history. The overvoltage characteristics information includes the concentrated overvoltage range.

The instructions may be configured to cause the controller to determine an area of a concentrated overvoltage zone defined by the concentrated overvoltage range, the differential voltage curve and the reference differential voltage curve. The overvoltage characteristics information further includes the area of the concentrated overvoltage zone.

The area indicates a magnitude of overvoltage accumulated in the battery over the concentrated overvoltage range.

The instructions may be configured to cause the controller to determine the threshold difference by dividing an integral value of the differential voltage difference by a size of a reference range, wherein the size of the reference range is a distance from a predetermined first depth of discharge to a predetermined second depth of discharge.

The instructions may be configured to cause the controller to determine the concentrated overvoltage range in the reference range.

An overvoltage characteristics evaluation method for a battery according to another aspect of the present disclosure includes determining a measured capacity history and a measured voltage history indicating a time-series change of capacity and voltage of the battery using current measurements and voltage measurements of the battery obtained during a discharge event executed subsequent to polarization-inducing pretreatment for the battery, determining a first measured voltage curve indicating a correlation between the measured capacity history and the measured voltage history, determining a second measured voltage curve indicating a correlation between a depth of discharge history obtained by normalizing the measured capacity history to a total discharge capacity of the measured capacity history and the measured voltage history, determining a differential voltage curve from the second measured voltage curve by differentiating the measured voltage history with respect to the depth of discharge history, and determining overvoltage characteristics information associated with the polarization-inducing pretreatment by comparing the differential voltage curve with a reference differential voltage curve.

The step of determining the overvoltage characteristics information associated with the polarization-inducing pretreatment may include determining a concentrated overvoltage range in which a differential voltage difference between the differential voltage curve and the reference differential voltage curve in an entire range of the depth of discharge history is equal to or larger than a threshold difference.

The step of determining the overvoltage characteristics information associated with the polarization-inducing pretreatment may further include determining an area of a concentrated overvoltage zone defined by the concentrated overvoltage range, the differential voltage curve and the reference differential voltage curve.

Advantageous Effects

According to at least one of the embodiments of the present disclosure, it is possible to evaluate overvoltage characteristics of a battery using Differential Voltage Analysis (DVA). In particular, a correlation between a measured voltage history and a measured capacity history may be converted to a correlation between the measured voltage history and a depth of discharge history. Here, the depth of discharge history may be obtained by normalizing the measured capacity history of a measured voltage curve obtained during a discharge event executed subsequent to polarization-inducing pretreatment for the battery to the depth of discharge history (in the range of 0~100%). Accordingly, it is possible to obtain, as a result of evaluation, a concentrated overvoltage range in which the overvoltage characteristics of the battery having undergone the polarization-inducing pretreatment are exhibited in a concentrated manner.

In addition, according to at least one of the embodiments of the present disclosure, it is possible to additionally obtain the magnitude of overvoltage accumulated over the concentrated overvoltage range as a result of evaluation.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Figure 1:
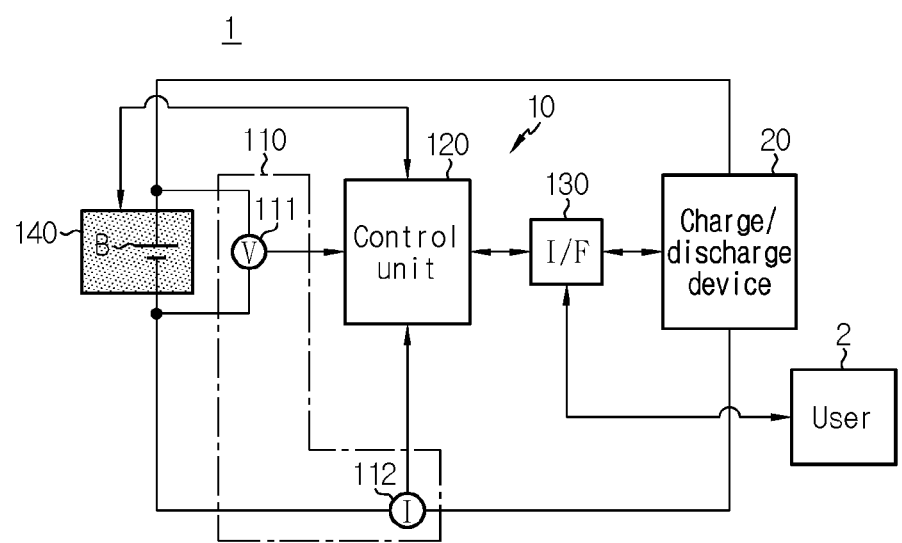
FIG. 1 is a diagram exemplarily showing a configuration of a battery evaluation system according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" as used herein refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

Figure 2:
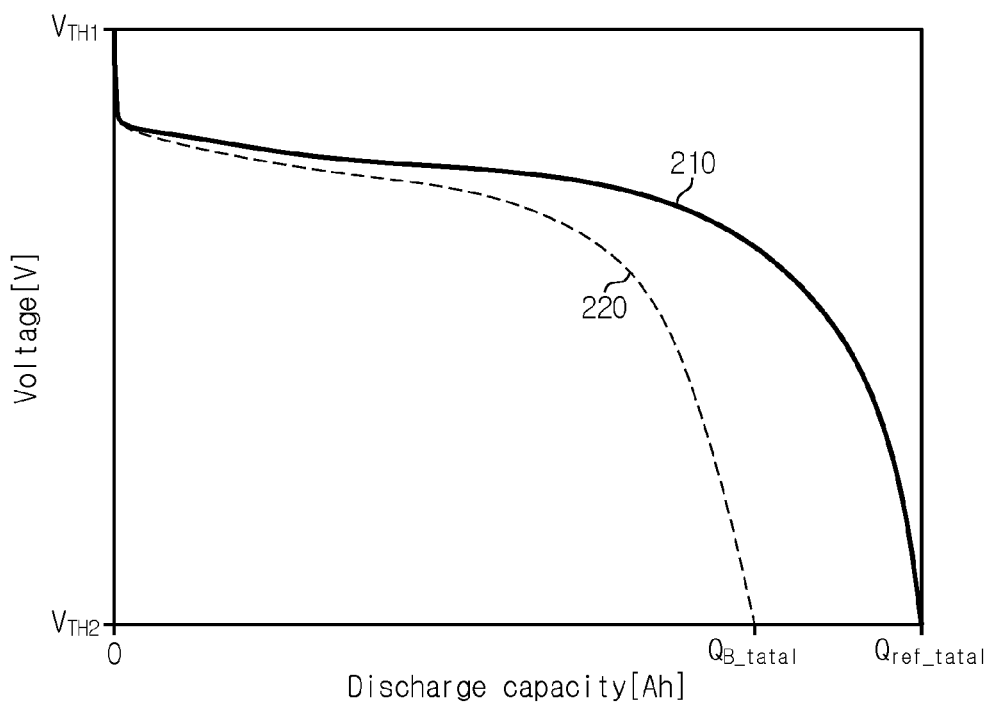
FIG. 2 is a diagram referenced in describing a relationship between a magnitude of overvoltage and a measured voltage curve.
Figure 3:
FIG. 3 is a diagram referenced in describing a result of normalizing a measured voltage curve.
Figure 4:
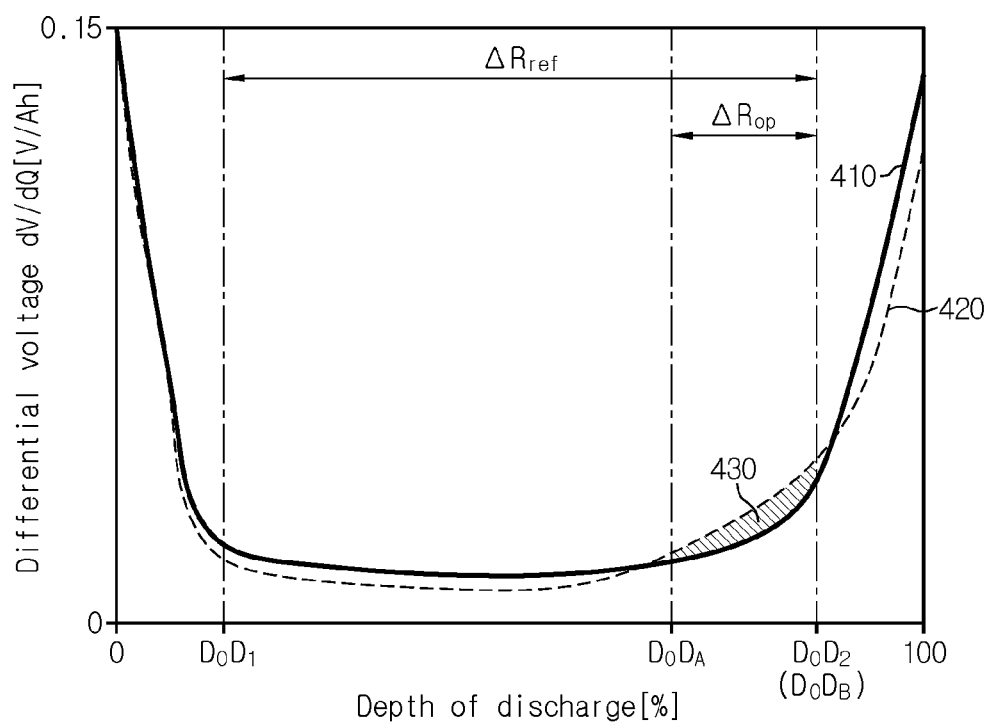
FIG. 4 is a diagram referenced in describing a differential voltage curve corresponding to a measured voltage curve.
Figure 5:
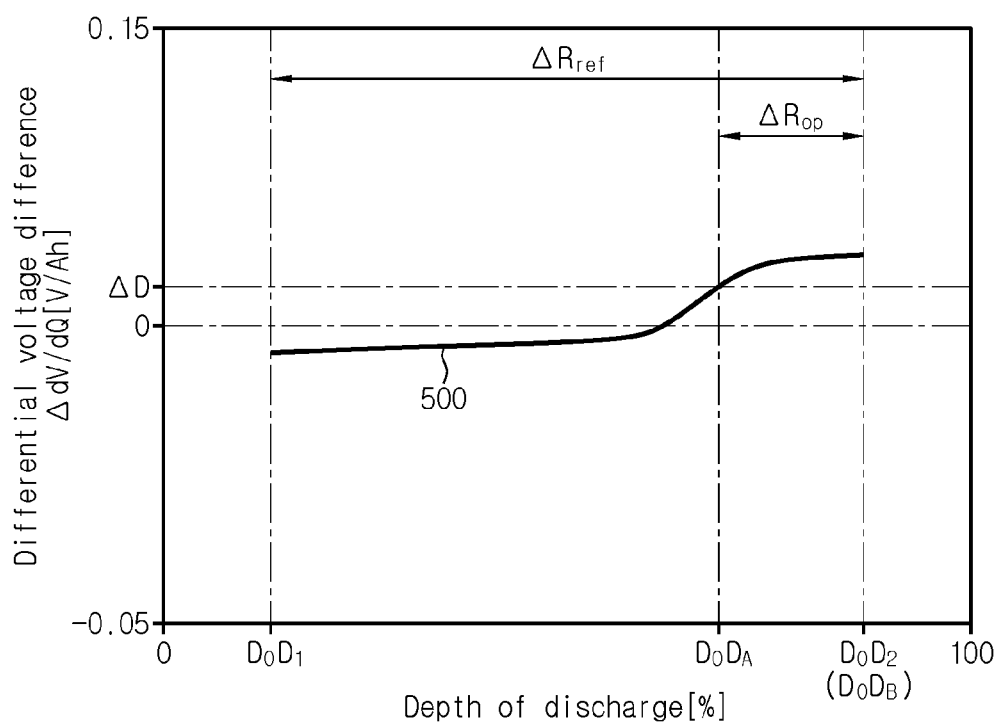
FIG. 5 is a diagram referenced in describing an operation of determining overvoltage characteristics from a differential voltage curve.

FIG. 1 is a diagram exemplarily showing a configuration of a battery evaluation system according to the present disclosure, FIG. 2 is a diagram referenced in describing a relationship between a magnitude of overvoltage and a measured voltage curve, FIG. 3 is a diagram referenced in describing a result of normalizing the measured voltage curve, FIG. 4 is a diagram referenced in describing a differential voltage curve corresponding to the measured voltage curve, and FIG. 5 is a diagram referenced in describing an operation of determining overvoltage characteristics from the differential voltage curve.

Referring to FIG. 1, the battery evaluation system 1 is provided to evaluate the overvoltage characteristics of a battery B. The battery B may be a lithium ion battery. The battery B is not limited to a particular type and may include any type of battery that can be recharged repeatedly.

The battery evaluation system 1 includes an overvoltage characteristics evaluation apparatus 10 (hereinafter referred to as the 'evaluation apparatus') and a charge/discharge device 20.

The charge/discharge device 20 is electrically connected to a current path for the charge/discharge of the battery B. That is, the charge/discharge device 20 is provided to be electrically connectable to the battery B in parallel through a pair of terminals. The charge/discharge device 20 may include a constant current circuit to adjust a current rate (referred to as 'C-rate') of the electric current flowing through the battery B. The charge/discharge device 20 is configured to adjust the current rate (referred to as 'C-rate') of the electric current for the charge or discharge of the battery B in response to a command from the evaluation apparatus 10. The charge/discharge device 20 may provide only one of a constant current discharging function and a constant current charging function.

The evaluation apparatus 10 includes a sensing unit 110 and a control unit 120. The evaluation apparatus 10 may further include at least one of an interface unit 130 or a temperature chamber 140. The following description is made under the assumption that the evaluation apparatus 10 includes all the sensing unit 110, the control unit 120, the interface unit 130 and the temperature chamber 140.

The sensing unit 110 includes a voltage sensor 111 and a current sensor 112.

The voltage sensor 111 is provided to be electrically connectable to the battery B in parallel. The voltage sensor 111 is configured to measure a voltage across the battery B, and generate a voltage signal indicating the measured voltage.

The current sensor 112 is provided to be electrically connectable to the battery B in series through the current path connecting the battery B and the charge/discharge device 20. The current sensor 112 is configured to measure the electric current flowing through the battery B, and generate a current signal indicating the measured current.

The control unit 120 may collect sensing information including the voltage signal and the current signal obtained in synchronization from the sensing unit 110.

The control unit 120 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions. The control unit 120 may have a memory embedded therein. The memory may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory may store data and programs required for the computation operation (methods as described below) by the control unit 120. The control unit 120 may record data indicating the result of the computation operation in the memory.

The control unit 120 is operably coupled to the charge/discharge device 20, the sensing unit 110, the interface unit 130 and the temperature chamber 140. Operably coupled refers to directly/indirectly connected to transmit and receive a signal in one or two directions.

The interface unit 130 is configured to support wired or wireless communication between the control unit 120 and a user terminal 2 (for example, a personal computer). The wired communication may be, for example, controller area network (CAN) communication, and the wireless communication may be, for example, Zigbee or Bluetooth communication. The communication protocol is not limited to a particular type and may include any communication protocol that supports wired/wireless communication between the control unit 120 and the user terminal 2. The interface unit 130 may include an output device (for example, a display, a speaker) to provide the information received from the control unit 120 and/or the user terminal 2 in a recognizable format.

The control unit 120 may determine a measured capacity history and a measured voltage history based on the sensing information (i.e., time-series of the measured current values and time-series of the measured voltage values) collected from the sensing unit 110 at a preset time interval during a discharge event of the battery B. The measured capacity history indicates a time-series change in the discharge capacity of the battery B from beginning to end of the discharge event. The measured voltage history indicates a time-series change in the voltage of the battery B from beginning to end of the discharge event. In the discharge event, a larger discharge capacity of the measured capacity history corresponds to a lower voltage of the measured voltage history.

The control unit 120 may record the measured capacity history and the measured voltage history in the memory. The discharge event may include constant current discharging. The discharge event may be executed while the temperature chamber 140 maintains the ambient temperature of the battery B at a preset temperature.

The constant current discharging is performed from a first time point at which the voltage of the battery B is equal to a first threshold voltage $V_{TH1}$ to a second time point at which the voltage of the battery B is equal to a second threshold voltage $V_{TH2}$ that is lower than the first threshold voltage $V_{TH1}$. For example, the first threshold voltage $V_{TH1}$ is an Open Circuit Voltage (OCV) of the battery B when the battery B is fully charged, and may be the same as a preset value, i.e., end-of-charge voltage. The second threshold voltage $V_{TH2}$ may be equal to a preset value as the OCV when the battery B is fully discharged, i.e., an end-ofdischarge voltage. The C-rate of constant current discharging may be, for example, a high current of 6.5 C-rate.

In FIG. 2, the X axis (vertical axis) indicates voltage, and the Y axis (horizontal axis) indicates discharge capacity. A first reference voltage curve 210 is pre-acquired through the discharge event for a reference battery (not shown) having undergone reference pretreatment, and a first measured voltage curve 220 is acquired through the discharge event for the battery B having undergone polarization-inducing pretreatment. The first reference voltage curve 210 indicates a correlation between a reference capacity history and a reference voltage history. The reference capacity history indicates a time-series change in the discharge capacity of the reference battery from beginning to end of the discharge event. The reference voltage history indicates a time-series change in the voltage of the reference battery from beginning to end of the discharge event. The battery B and the reference battery are manufactured with the same electrical and chemical characteristics.

Below is an example of each of reference pretreatment and polarization-inducing pretreatment.

<Reference pretreatment> The reference pretreatment may include a series of the following processes.
Fully discharge using a predetermined first current profile from a predetermined SOC (for example, 30%)
Place at a predetermined first temperature (for example, 80° C.) for a predetermined first time (for example, 6 hours)
Fully charge using a predetermined second current profile <Polarization-inducing pretreatment> The polarization-inducing pretreatment may include a series of the following processes.
Fully discharge using a predetermined first current profile from a predetermined SOC (for example, 30%)
Place at a predetermined second temperature (for example, 25° C.) for a predetermined second time (for example, 3 hours)
Fully charge using a predetermined second current profile When comparing the reference pretreatment with the polarization-inducing pretreatment in the above-described example, the polarization-inducing pretreatment in which the battery B is placed at a second temperature (room temperature), instead of a first temperature (high temperature), is different from the reference pretreatment. Due to this difference, the reference battery undergoes the discharge event in a state that polarization completely disappeared, whereas the battery B undergoes the discharge event in a state that the battery B is still polarized. The reference pretreatment is not limited to the above-described example when the reference pretreatment is performed to reduce the polarization of the battery B to below a predetermined level at the start of the discharge event. Likewise, the polarization-inducing pretreatment is not limited to the above-described example when it is performed to form larger polarization in the battery B than the reference pretreatment.

After the user puts the battery B in the temperature chamber 140, the user may request the evaluation apparatus 10 to perform polarization-inducing pretreatment. In response to the request received from the user terminal 2 through the interface unit 130, the control unit 120 may control the charge/discharge device 20 and the temperature chamber 140 to perform the processes of the polarization-inducing pretreatment in a sequential order. The temperature chamber 140 is a device having an internal space in which the battery B may be received, and the temperature of the internal space (i.e., the ambient temperature of the battery B) may be detected and adjusted. In response to the completion of the polarization-inducing pretreatment, the control unit 120 may perform the discharge event for the battery B. Alternatively, the polarization-inducing pretreatment may be performed using a separate tester instead of the evaluation apparatus 10.

It can be seen from FIG. 2 that a difference between the first reference voltage curve 210 and the first measured voltage curve 220 corresponding to a polarization difference between the battery B and the reference battery occurs during the discharge event. Specifically, the first measured voltage curve 220 shows voltage decrease behaviors generally faster than the first reference voltage curve 210, and it can be seen that the total discharge capacity $Q_{B\_total}$ of the battery B corresponding to the second threshold voltage $V_{TH2}$ decreases from the total discharge capacity $Q_{ref\_total}$ of the reference battery. This is because polarization remaining in the battery B is exhibited as overvoltage by the electric current of the discharge event.

As a result, the reference voltage history of the first reference voltage curve 210 and the measured voltage history of the first measured voltage curve 220 have the same voltage range, but the reference capacity history of the first reference voltage curve 210 and the measured capacity history of the first measured voltage curve 220 do not have the same capacity range. Accordingly, for easy comparison between the first reference voltage curve 210 and the first measured voltage curve 220, the control unit 120 may determine a first depth of discharge history and a second depth of discharge history having the same range of 0~1 or 0~100% by normalizing the reference capacity history of the first reference voltage curve 210 and the measured capacity history of the first measured voltage curve 220, respectively.

The reference capacity history of the first reference voltage curve 210 and the first depth of discharge history may have the following relation $$DoD_{ref}[i] = \frac{Q_{ref}[i]}{Q_{ref\_total}} \times 100[\%]$$

When i is a natural number of 1 or greater, $Q_{ref\_total}$ is the total discharge capacity of the first reference voltage curve 210, $Q_{ref}[i]$ is the discharge capacity of the reference battery determined at the $i^{th}$ time during the discharge event, and $DoD_{ref}[i]$ is a value obtained by normalizing $Q_{ref}[i]$ using $Q_{ref\_total}$. The first depth of discharge history may be a set (time-series) of $DoD_{ref}[i]$ during the discharge event.

The measured capacity history of the first measured voltage curve 220 and the second depth of discharge history may have the following relation $$DoD_{bat}[j] = \frac{Q_B[j]}{Q_{B\_total}} \times 100[\%]$$

When j is a natural number of 1 or greater, $Q_{B\_total}$ is the total discharge capacity of the first measured voltage curve 220, $Q_B[j]$ is the discharge capacity of the battery B determined at the $i^{th}$ time during the discharge event, and $DoD_B[j]$ is a value obtained by normalizing $Q_B[j]$ using $Q_{B\_total}$. The second depth of discharge history may be a set (time-series) of $DoD_B[j]$ during the discharge event.

In FIG. 3, the X axis (vertical axis) indicates voltage, and the Y axis (horizontal axis) indicates the depth of discharge corresponding to the discharge capacity of FIG. 2. Referring to FIG. 3, the control unit 120 may determine a second reference voltage curve 310 from the first reference voltage curve 210 by converting a correlation between the reference capacity history and the reference voltage history to a correlation between the first depth of discharge history and the reference voltage history.

Likewise, the control unit 120 may determine a second measured voltage curve 320 from the first measured voltage curve 220 by converting a correlation between the measured capacity history and the measured voltage history of the first measured voltage curve 220 to a correlation between the second depth of discharge history and the measured voltage history. As a result, the reference voltage history of the second reference voltage curve 310 and the measured voltage history of the second measured voltage curve 320 are scaled with respect to the depth of discharge in the common range of 0~100%.

In FIG. 4, the X axis (vertical axis) indicates a differential voltage, the Y axis (horizontal axis) is the same as the Y axis of FIG. 3. The differential voltage dV/dQ is a ratio of a change dV in voltage to a change dQ in discharge capacity (or depth of discharge).

Referring to FIG. 4, the control unit 120 may determine a reference differential voltage curve 410 from the second reference voltage curve 310 by differentiating the reference voltage history of the second reference voltage curve 310 with respect to the first depth of discharge history.

Alternatively, the reference differential voltage curve 410 may be recorded in the memory according to a result of a test conducted in advance, instead of being determined by the control unit 120. That is, the reference differential voltage curve 410 may be preset as a differential voltage curve when the discharge event is executed in a zero polarization state of the battery B, i.e., the battery B did not yet undergo the polarization-inducing pretreatment, and.

The control unit 120 may determine a differential voltage curve 420 from the second measured voltage curve 320 by differentiating the measured voltage history of the second measured voltage curve 320 with respect to the second depth of discharge history. The differential voltage curve 420 may indicate a time-series of a ratio of a change in voltage to (i) the depth of discharge (or its corresponding discharge capacity) and (ii) a unit change of the depth of discharge (or a change of corresponding discharge capacity, in the entire range of 0~100%.

The control unit 120 determines overvoltage characteristics information of the battery B from the differential voltage curve 420 by comparing the reference differential voltage curve 410 with the differential voltage curve 420. The control unit 120 may associate the overvoltage characteristics information to the polarization-inducing pretreatment and record in the memory.

FIG. 5 is a graph exemplarily showing a polarization comparison curve 500 indicating a correlation between a differential voltage difference ΔdV/dQ and the depth of discharge over a reference range $\Delta R_{ref}$. In FIG. 5, the X axis (vertical axis) indicates the differential voltage difference ΔdV/dQ, and the Y axis (horizontal axis) is the same as the Y axis of FIG. 4.

The control unit 120 may determine the differential voltage difference ΔdV/dQ between the reference differential voltage curve 410 and the differential voltage curve 420 with respect to the depth of discharge in the reference range $\Delta R_{ref}$. The differential voltage difference ΔdV/dQ corresponding to each depth of discharge may be a value obtained by subtracting the differential voltage of the reference differential voltage curve 410 from the differential voltage of the differential voltage curve 420. The reference range $\Delta R_{ref}$ is from a predetermined first depth of discharge $DoD_1$ (for example, 10%) larger than 0% to a predetermined second depth of discharge $DoD_2$ (for example, 90%) smaller than 100%. The reason of using the reference range $\Delta R_{ref}$ is that the discharge reaction of the battery B is very unstable in the range of 0%~the first depth of discharge $DoD_1$ and the range of the second depth of discharge $DoD_2$~100%.

The control unit 120 may determine a concentrated overvoltage range $\Delta R_{op}$, i.e., a range in which the differential voltage difference ΔdV/dQ of the polarization comparison curve 500 is equal to or larger than a threshold difference ΔD in the entire range (i.e., 0~100%) of the depth of discharge history. The overvoltage characteristics information may include the concentrated overvoltage range $\Delta R_{op}$. For example, in FIG. 5, the differential voltage of the differential voltage curve 420 is kept higher by at least the threshold difference ΔD than the differential voltage of the reference differential voltage curve 410 over the concentrated overvoltage range $\Delta R_{op}$ from the first depth of discharge $DoD_A$ to the second depth of discharge $DoD_B$. The threshold difference ΔD may be a preset value. Alternatively, the control unit 120 may determine the threshold difference ΔD based on an integral value of the differential voltage difference ΔdV/dQ over the reference range $\Delta R_{ref}$. For example, the control unit 120 may determine the threshold difference ΔD to be equal to a value obtained by dividing the integral value by the size of the reference range $\Delta R_{ref}$ (i.e., $DoD_2$-$DoD_1$).

The control unit 120 may be further configured to determine an area of a concentrated overvoltage zone 430. The concentrated overvoltage zone 430 is a zone defined by the concentrated overvoltage range $\Delta R_{op}$, the differential voltage curve 420 and the reference differential voltage curve 410. The area of the concentrated overvoltage zone 430 is a difference between a voltage change of the second measured voltage curve 320 and a voltage change of the second reference voltage curve 310 over the concentrated overvoltage range $\Delta R_{op}$. That is, the area of the concentrated overvoltage zone 430 indicates the magnitude of overvoltage accumulated in the battery B over the concentrated overvoltage range $\Delta R_{op}$. The overvoltage characteristics information may further include the area the concentrated overvoltage zone.

Figure 6:
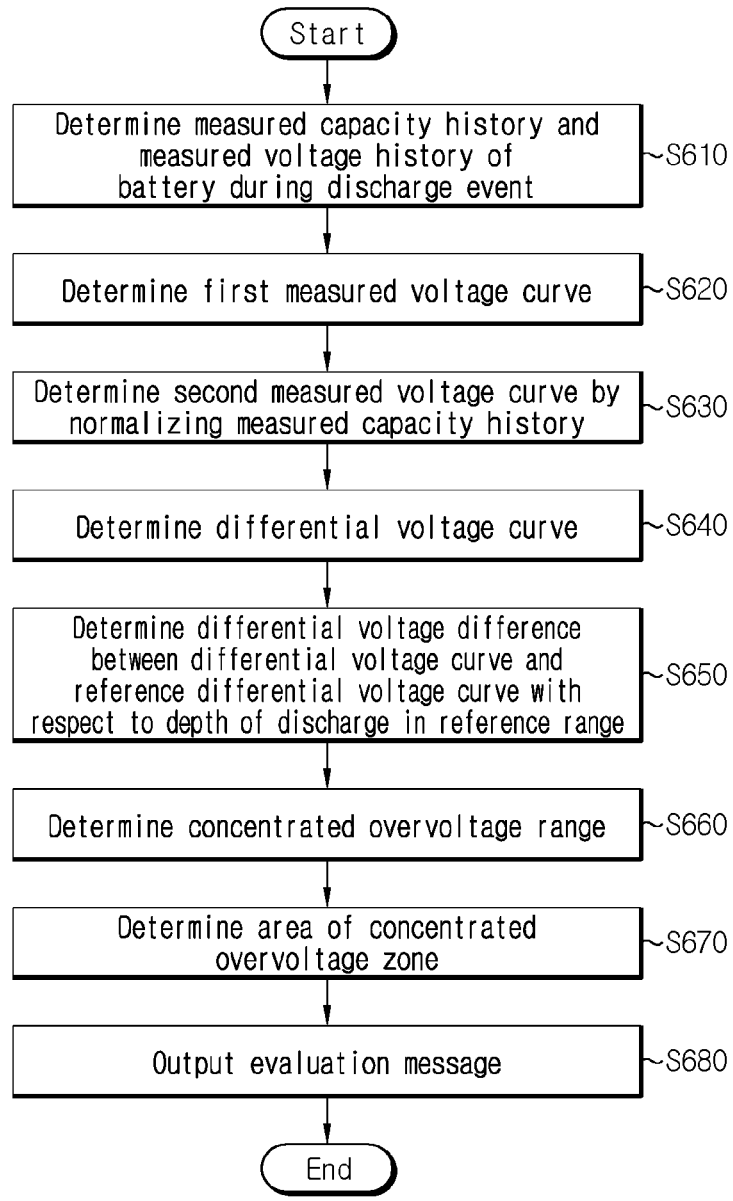
FIG. 6 is a flowchart exemplarily showing a method for evaluating overvoltage characteristics of a battery according to a first embodiment of the present disclosure.

FIG. 6 is a flowchart exemplarily showing a method for evaluating overvoltage characteristics of a battery according to a first embodiment of the present disclosure. The method of FIG. 6 is performed after the polarization-inducing pretreatment for the battery B is completed.

Referring to FIGS. 1 to 6, in step S610, the control unit 120 determines a measured capacity history and a measured voltage history indicating a time-series change in capacity and voltage of the battery B during the discharge event of the battery B, respectively. The measured capacity history is based on the accumulated value of the electric current measured by the current sensor 112 at a predetermined time interval during the discharge event. The measured voltage history is based on the voltage across the battery B measured by the voltage sensor 111 at the predetermined time interval during the discharge event.

In step S620, the control unit 120 determines a first measured voltage curve 220 indicating a correlation between the measured capacity history and the measured voltage history.

In step S630, the control unit 120 determines a second measured voltage curve 320 indicating a correlation between a depth of discharge history corresponding to the measured capacity history and the measured voltage history by normalizing the measured capacity history to the total discharge capacity $Q_{B\_total}$ of the measured capacity history.

In step S640, the control unit 120 determines a differential voltage curve 420 from the second measured voltage curve 320 by differentiating the measured voltage history with respect to the depth of discharge history.

In step S650, the control unit 120 determines a differential voltage difference between the differential voltage curve and the reference differential voltage curve with respect to the depth of discharge in the reference range $\Delta R_{ref}$.

In step S660, the control unit 120 determines a concentrated overvoltage range $\Delta R_{op}$, i.e., a range in which the differential voltage difference is equal to or larger than a threshold difference $\Delta D$ in the reference range $\Delta R_{ref}$. The threshold difference $\Delta D$ may be pre-recorded in the memory.

In step S670, the control unit 120 determines an area of a concentrated overvoltage zone 430 defined by the concentrated overvoltage range $\Delta R_{op}$, the differential voltage curve 420 and the reference differential voltage curve 410. The step S670 may be omitted from the method of FIG. 6.

In step S680, the control unit 120 outputs an evaluation message indicating overvoltage characteristics information of the battery B. The overvoltage characteristics information includes at least one of the concentrated overvoltage range $\Delta R_{op}$ or the area of the concentrated overvoltage zone 430. The interface unit 130 may transmit the evaluation message to the user terminal 2 or output visual and/or audible information corresponding to the evaluation message.

Figure 7:
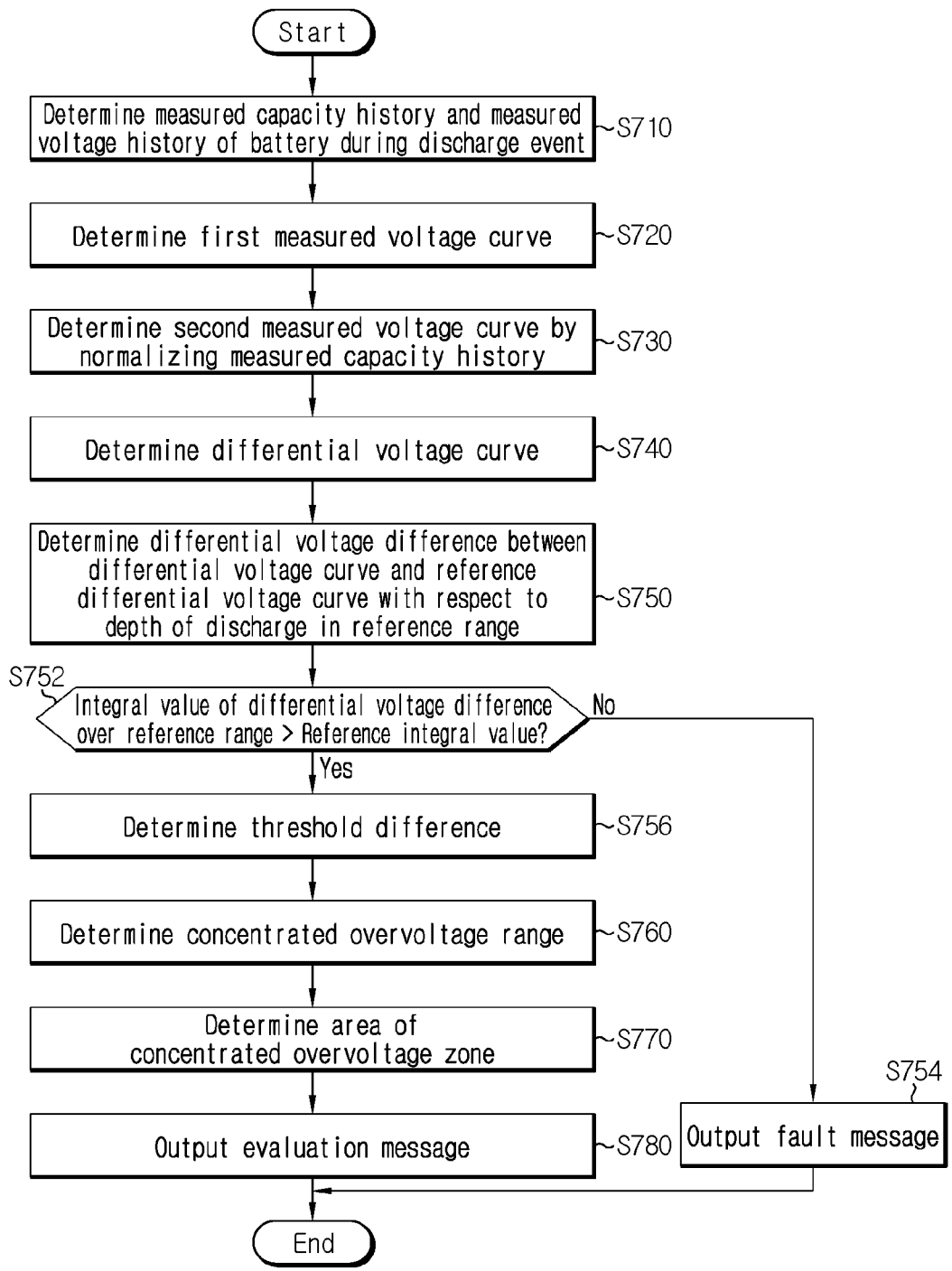
FIG. 7 is a flowchart exemplarily showing a method for evaluating overvoltage characteristics of a battery according to a second embodiment of the present disclosure.

FIG. 7 is a flowchart exemplarily showing a method for evaluating overvoltage characteristics of a battery according to a second embodiment of the present disclosure. The method of FIG. 7 is performed after the polarization-inducing pretreatment for the battery B is completed. In describing the second embodiment, a repeated description in common with the first embodiment may be omitted herein.

FIGS. 1 to 5 and 7, in step S710, the control unit 120 determines a measured capacity history and a measured voltage history indicating a time-series change in capacity and voltage of the battery B during the discharge event of the battery B.

In step S720, the control unit 120 determines a first measured voltage curve 220 indicating a correlation between the measured capacity history and the measured voltage history.

In step S730, the control unit 120 determines a second measured voltage curve 320 indicating a correlation between a depth of discharge history corresponding to the measured capacity history and the measured voltage history by normalizing the measured capacity history to the total discharge capacity $Q_{B\_total}$ of the measured capacity history.

In step S740, the control unit 120 determines a differential voltage curve 420 from the second measured voltage curve 320 by differentiating the measured voltage history with respect to the depth of discharge history.

In step S750, the control unit 120 determines a differential voltage difference between the differential voltage curve 420 and the reference differential voltage curve 410 with respect to the depth of discharge in the reference range $\Delta R_{ref}$.

In step S752, the control unit 120 determines whether an integral value of the differential voltage difference over the reference range $\Delta R_{ref}$ is larger than a reference integral value. When a value of the step S752 is "Yes", step S756 is performed. The value of the step S752 being "No" may indicate that a computation error occurred in the steps S710-S750. When the value of the step S752 is "No", step S754 is performed.

In step S754, the control unit 120 outputs a fault message. The interface unit 130 may transmit the fault message to the user terminal 2 or output visual and/or audible information corresponding to the fault message. The steps S752 and S754 may be omitted from the method of FIG. 7, and after the step S750, step S756 may be performed.

In step S756, the control unit 120 determines a threshold difference $\Delta D$ based on the integral value of the differential voltage difference over the reference range $\Delta R_{ref}$.

In step S760, the control unit 120 determines a concentrated overvoltage range $\Delta R_{op}$, i.e., a range in which the differential voltage difference is equal to or larger than the threshold difference $\Delta D$ in the reference range $\Delta R_{ref}$.

In step S770, the control unit 120 determines an area of a concentrated overvoltage zone 430 defined by the concentrated overvoltage range $\Delta R_{op}$, the differential voltage curve 420 and the reference differential voltage curve 410. The step S770 may be omitted from the method of FIG. 7.

In step S780, the control unit 120 outputs an evaluation message indicating overvoltage characteristics information of the battery B. The overvoltage characteristics information includes at least one of the threshold difference $\Delta D$, the concentrated overvoltage range $\Delta R_{op}$ or the area of the concentrated overvoltage zone 430.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. An overvoltage characteristics evaluation apparatus for a battery, comprising:
   a current sensor configured to measure a current of the battery;
   a voltage sensor configured to measure a voltage of the battery;
   a controller; and
   memory having instructions programmed thereon that, when executed by the controller, cause the controller to:
   determine a measured capacity history indicating a time-series change in capacity of the battery using sensing information obtained from at least one of the voltage sensor or the current sensor during a discharge event executed subsequent to polarization-inducing pretreatment for the battery;
   determine a measured voltage history indicating a time-series change in voltage of the battery using sensing information obtained from at least one of the voltage sensor or the current sensor during the discharge event, determine a first measured voltage curve indicating a correlation between the measured capacity history and the measured voltage history, determine a second measured voltage curve indicating a correlation between (i) a depth of discharge history obtained by normalizing the measured capacity history to a total discharge capacity of the measured capacity history and (ii) the measured voltage history, determine a differential voltage curve from the second measured voltage curve by differentiating the measured voltage history with respect to the depth of discharge history, and determine overvoltage characteristics information associated with the polarization-inducing pretreatment by comparing the differential voltage curve with a reference differential voltage curve.

2. The overvoltage characteristics evaluation apparatus according to claim 1, wherein the discharge event includes constant current discharging from a first time point to a second time point, wherein the voltage of the battery is equal to a first threshold voltage at the first time point, and wherein the voltage of the battery is equal to a second threshold voltage that is lower than the first threshold voltage at the second time point.

3. The overvoltage characteristics evaluation apparatus according to claim 1, wherein the instructions are configured to cause the controller to determine a concentrated overvoltage range in which a differential voltage difference between the differential voltage curve and the reference differential voltage curve is equal to or larger than a threshold difference in an entire range of the depth of discharge history, and the overvoltage characteristics information includes the concentrated overvoltage range.

4. The overvoltage characteristics evaluation apparatus according to claim 3, wherein the instructions are configured to cause the controller to determine an area of a concentrated overvoltage zone defined by the concentrated overvoltage range, the differential voltage curve and the reference differential voltage curve, and the overvoltage characteristics information further includes the area of the concentrated overvoltage zone.

5. The overvoltage characteristics evaluation apparatus according to claim 4, wherein the area indicates a magnitude of overvoltage accumulated in the battery over the concentrated overvoltage range.

6. The overvoltage characteristics evaluation apparatus according to claim 3, wherein the instructions are configured to cause the controller to determine the threshold difference by dividing an integral value of the differential voltage difference by a size of a reference range, wherein the size of the reference range is a distance from a predetermined first depth of discharge to a predetermined second depth of discharge.

7. The overvoltage characteristics evaluation apparatus according to claim 6, wherein the instructions are configured to cause the controller to determine the concentrated overvoltage range in the reference range.

8. An overvoltage characteristics evaluation method for a battery, comprising:

determining, by a controller, a measured capacity history and a measured voltage history indicating a time-series change of capacity and voltage of the battery using current measurements and voltage measurements of the battery obtained during a discharge event executed subsequent to polarization-inducing pretreatment for the battery;

determining, by the controller, a first measured voltage curve indicating a correlation between the measured capacity history and the measured voltage history;

determining, by the controller, a second measured voltage curve indicating a correlation between (i) a depth of discharge history obtained by normalizing the measured capacity history to a total discharge capacity of the measured capacity history and (ii) the measured voltage history;

determining, by the controller, a differential voltage curve from the second measured voltage curve by differentiating the measured voltage history with respect to the depth of discharge history; and determining, by the controller, overvoltage characteristics information associated with the polarization-inducing pretreatment by comparing the differential voltage curve with a reference differential voltage curve.

9. The overvoltage characteristics evaluation method according to claim 8, wherein determining the overvoltage characteristics information associated with the polarization-inducing pretreatment comprises determining a concentrated overvoltage range in which a differential voltage difference between the differential voltage curve and the reference differential voltage curve in an entire range of the depth of discharge history is equal to or larger than a threshold difference.

10. The overvoltage characteristics evaluation method according to claim 9, wherein determining the overvoltage characteristics information associated with the polarization-inducing pretreatment further comprises determining an area of a concentrated overvoltage zone defined by the concentrated overvoltage range, the differential voltage curve and the reference differential voltage curve.

* * * * *